(12) United States Patent
Tsai et al.

(10) Patent No.: US 9,117,745 B2
(45) Date of Patent: Aug. 25, 2015

(54) MECHANISMS FOR FORMING STRESSOR REGIONS IN A SEMICONDUCTOR DEVICE

(71) Applicant: TAIWAN SEMICONDUCTOR MANUFACTURING COMPANY, LTD., Hsinchu (TW)

(72) Inventors: Chun Hsiung Tsai, Xinpu Township (TW); Tsan-Chun Wang, Hsinchu (TW); Su-Hao Liu, Jhongpu Township (TW); Tsz-Mei Kwok, Hsinchu (TW); Chii-Ming Wu, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/173,370

(22) Filed: Feb. 5, 2014

(65) Prior Publication Data

US 2014/0154876 A1 Jun. 5, 2014

Related U.S. Application Data

(62) Division of application No. 13/324,331, filed on Dec. 13, 2011, now Pat. No. 8,674,453.

(51) Int. Cl.
*H01L 21/336* (2006.01)
*H01L 21/8234* (2006.01)
*H01L 21/22* (2006.01)
*H01L 29/32* (2006.01)
(Continued)

(52) U.S. Cl.
CPC .......... *H01L 21/22* (2013.01); *H01L 21/26506* (2013.01); *H01L 29/0688* (2013.01); *H01L 29/0847* (2013.01); *H01L 29/32* (2013.01); *H01L 29/78* (2013.01); *H01L 29/7843* (2013.01); *H01L 29/7848* (2013.01); *H01L 21/823412* (2013.01); *H01L 21/823418* (2013.01); *H01L 21/823425* (2013.01)

(58) Field of Classification Search
CPC ............ H01L 21/8228; H01L 21/8232; H01L 21/8238; H01L 21/823814; H01L 29/49; H01L 29/94; H01L 29/7842
USPC .......................... 438/197, 198, 199, 301, 303
See application file for complete search history.

(56) References Cited

U.S. PATENT DOCUMENTS 7,928,427 B1 4/2011 Chang
2005/0095799 A1 5/2005 Wang et al.
(Continued)

OTHER PUBLICATIONS

Lim, Kwan-Young et al., "Novel-Stress Memorization-Technology (SMT) for High Electron Mobility Enhancement of Gate Last High-k/Metal Gate Devices", IEEE 2010, pp. 10.1.1-10.1.4.
(Continued)

*Primary Examiner* — Hoai V Pham
(74) *Attorney, Agent, or Firm* — Lowe Hauptman & Ham, LLP

(57) ABSTRACT

A method of manufacturing a semiconductor device includes performing a pre-amorphous implantation (PAI) process to form an amorphized region on a substrate. The method also includes forming a stress film over the substrate, and performing an annealing process to recrystallize the amorphized region after the stress film is formed. The method further includes forming a recess region on the substrate. The recess region overlies the recrystallized region. The method additionally includes forming an epitaxial stress-inducing material in the recess region.

20 Claims, 8 Drawing Sheets

(51) Int. Cl.
*H01L 29/78* (2006.01)
*H01L 21/265* (2006.01)
*H01L 29/06* (2006.01)
*H01L 29/08* (2006.01)

(56) References Cited

U.S. PATENT DOCUMENTS

| | | |
|---|---|---|
| 2006/0228842 A1 | 10/2006 | Zhang et al. |
| 2006/0234504 A1 | 10/2006 | Bauer et al. |
| 2010/0025779 A1 | 2/2010 | Kammler et al. |
| 2010/0148270 A1 | 6/2010 | Golonzka et al. |
| 2011/0027956 A1 | 2/2011 | Domenicucci et al. |
| 2011/0068403 A1 | 3/2011 | Hattendorf et al. |
| 2012/0104486 A1 | 5/2012 | Yin et al. |
| 2012/0104498 A1 | 5/2012 | Majumdar et al. |
| 2013/0099314 A1* | 4/2013 | Lu et al. .................. 257/347 |

OTHER PUBLICATIONS

Fischer, P. R. et al., "Low Temperature Silcore Deposition of Undoped and Doped Silicon Films", ECS Transactions, 3 (2) 203-215 (2006).

* cited by examiner

MECHANISMS FOR FORMING STRESSOR REGIONS IN A SEMICONDUCTOR DEVICE

PRIORITY CLAIM

The present application is divisional of U.S. application Ser. No. 13/324,331, filed Dec. 13, 2011, which is incorporated by reference herein in its entirety.

RELATED APPLICATIONS

The present application is related to U.S. patent application Ser. No. 13/177,309, filed Jul. 6, 2011, and U.S. patent application Ser. No. 13/029,378, filed Feb. 17, 2011, both of which are incorporated herein by reference in their entireties. The present application is also related to U.S. patent application Ser. No. 13/324,257, filed Dec. 13, 2011, which is also incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Stress distorts or strains the semiconductor crystal lattice, which affects the band alignment and charge transport properties of the semiconductor. By controlling the magnitude and distribution of stress in a finished device, manufacturers can increase carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
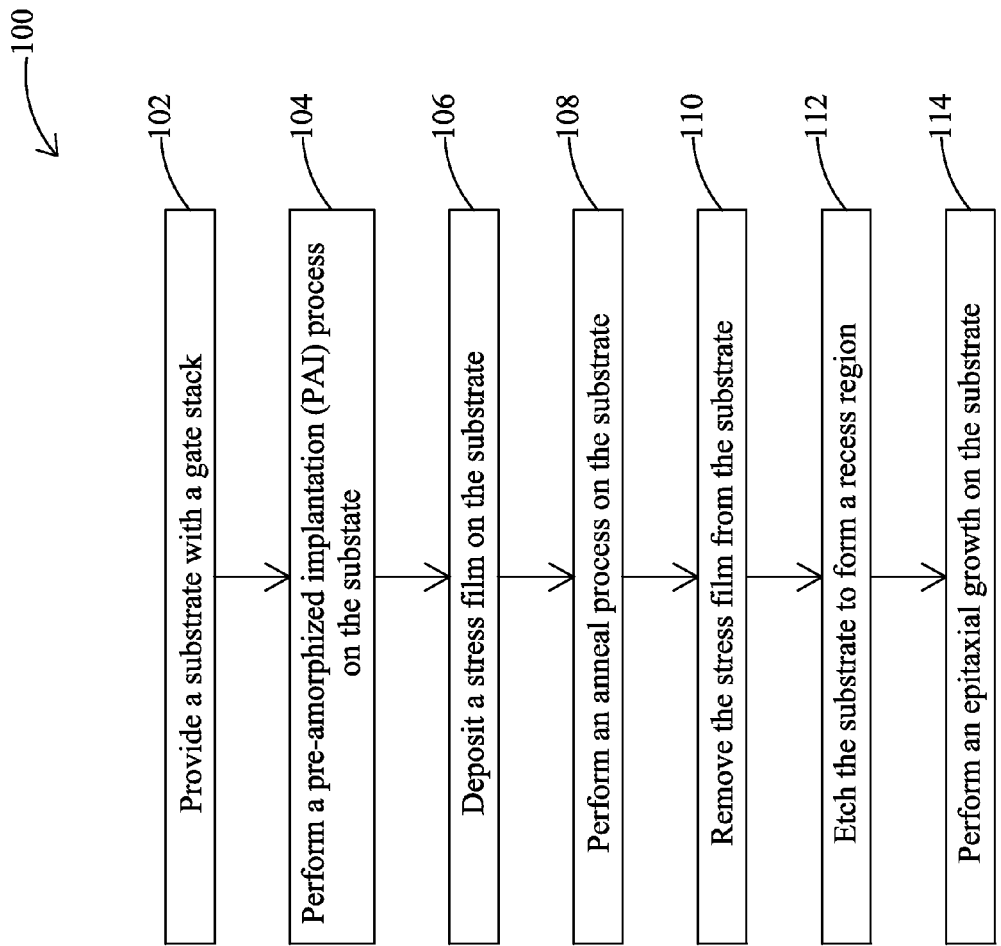
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present invention. It is understood, however, that the invention should not be limited to a particular type of device, except as specifically claimed.

With reference to FIGS. 1 and 2-8, a method 100 and a semiconductor device 200 are collectively described below. The semiconductor device 200 illustrates an integrated circuit, or portion thereof. In some embodiments, the semiconductor device 200 comprises active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. In some embodiments, the semiconductor device 200 additionally includes passive components, such as resistors, capacitors, inductors, and/or fuses. In some embodiments, the semiconductor device 200 is formed by CMOS technology processing, and thus some processes are not described in detail herein. In some embodiments, additional steps are provided before, during, and after the method 100, and some of the steps described below can be replaced or eliminated, for additional embodiments of the method. In some embodiments, additional features are added in the semiconductor device 200, and some of the features described below are replaced or eliminated, for additional embodiments of the semiconductor device 200.

Referring to FIG. 1, a method 100 for fabricating a semiconductor device is described according to various aspects of the present disclosure. The method 100 begins with step 102 in which a substrate is provided. The substrate includes a gate structure with a gate stack. The method 100 continues with step 104 in which a pre-amorphous implantation (PAI) process is performed on the substrate. The method 100 continues at step 106 in which a stress film is deposited on the substrate. The method 100 continues at step 108 in which an anneal process is performed on the substrate. The method 100 continues at step 110 in which the stress film is removed. The method 100 continues at step 112 in which a recess region is formed on the substrate by etching. The method 100 continues at step 114 in which an epitaxial growth is performed on the substrate. The discussion that follows illustrates various embodiments of a semiconductor device 200 that can be fabricated according to the method 100 of FIG. 1.

Figure 2:
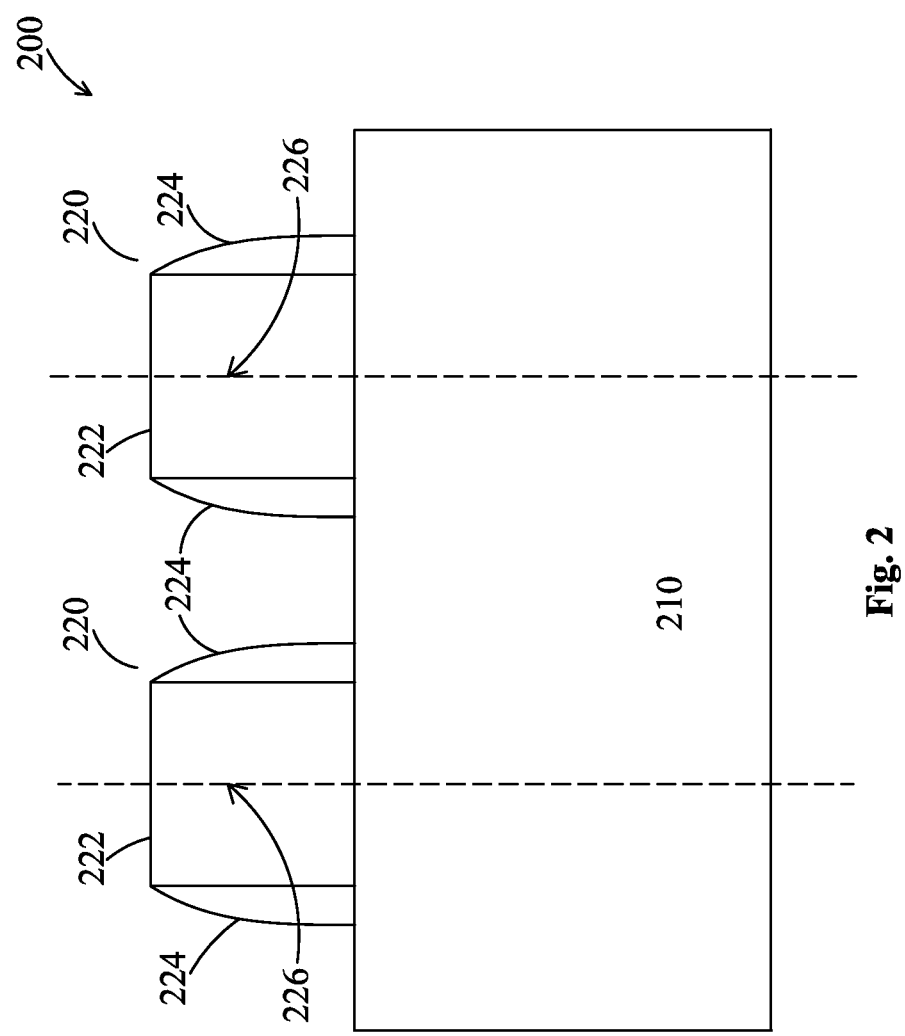
FIGS. 2 to 8 illustrate diagrammatic cross-sectional side views of one or more embodiments of a semiconductor device at various stages of fabrication according to the method of FIG. 1.

FIGS. 2 to 8 illustrate diagrammatic cross-sectional side views of one or more embodiments of a semiconductor device 200 at various stages of fabrication according to the method 100 of FIG. 1. Referring to FIG. 2, the semiconductor device 200 includes a substrate 210. In the present embodiment, the substrate 210 is a semiconductor substrate including silicon. Alternatively, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, where the substrate 210 is an alloy semiconductor; the alloy semiconductor substrate has a gradient SiGe feature in which the Si and Ge composition change from one ratio at one location to another ratio at another location of the gradient SiGe feature. In some embodiments, the alloy SiGe is formed over a silicon substrate, and/or the SiGe substrate is strained. In yet another alternative, the semiconductor substrate is a semiconductor on insulator (SOI).

The substrate 210 includes various doped regions depending on design requirements as known in the art (e.g., p-type wells or n-type wells). The doped regions are doped with p-type dopants, such as boron or $BF_2$, and/or n-type dopants, such as phosphorus or arsenic. In some embodiments, the doped regions are formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

In some embodiments, the substrate 210 includes an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 2, the substrate 210 includes gate structures 220 disposed over channel regions. In some embodiments, the substrate 210 further includes a source region and a drain region on both sides of one of the gate structures 220, the channel region being the region between the source region and the drain region. In some embodiments, lightly-doped drains (LDDs) are formed in substrate 210. In some embodiments, portions of the LDDs are formed under the gate structures 220. For NMOS transistors, N-type lightly-doped drains (LDDs), are formed of n-type dopants, such as phosphorous, arsenic, and/or other group V elements. In some embodiments, P-type pocket doped regions are also formed in substrate 210.

The gate structure 220 includes various gate material layers. In the present embodiment, the gate structure 220 includes a gate stack 222, which includes one or more gate dielectric layer and a gate electrode. In some embodiments, the gate structure 220 also includes gate spacers 224 disposed on sidewalls of the gate stack 222. In some embodiments, the gate structure 220 is divided into two substantially equal halves by an imaginary center line 226.

The gate stack 222 is formed over the substrate 210 to a suitable thickness. In an example, the gate stack 222 includes a polycrystalline silicon (or polysilicon) layer. In some embodiments, the polysilicon layer is doped for proper conductivity. Alternatively, the polysilicon is not necessarily doped, for example, if a dummy gate is to be formed and later replaced by a gate replacement process. In another example, the gate stack 222 includes a conductive layer having a proper work function; therefore, the gate stack 222 is also referred to as a work function layer. The work function layer includes a suitable material, such that the layer is tuned to have a proper work function for enhanced performance of the device. For example, if an N-type work function metal (N-metal) for an NMOS device is desired, Ta, TiAl, TiAlN, or TaCN, is used. In some embodiments, the work function layer includes doped conducting oxide materials. In some embodiments, the gate stack 222 includes other conductive materials, such as aluminum, copper, tungsten, metal alloys, metal silicide, other suitable materials, and/or combinations thereof. In some embodiments, the gate stack 222 includes multiple layers. For example, where the gate stack 222 includes a work function layer, another conductive layer is formed over the work function layer. In some embodiments, the gate stack 222 is formed by chemical vapor deposition (CVD), physical vapor deposition (PVD), atomic layer deposition (ALD), high density plasma CVD (HDPCVD), plating, other suitable methods, and/or combinations thereof.

The gate spacers 224 are formed over the substrate 210 by any suitable process to any suitable thickness. The gate spacers 224 include a dielectric material, such as silicon nitride, silicon oxide, silicon oxynitride, other suitable materials, and/or combinations thereof. In some embodiments, the gate spacers 224 are used to offset subsequently formed doped regions, such as heavily doped source/drain regions.

Figure 3:
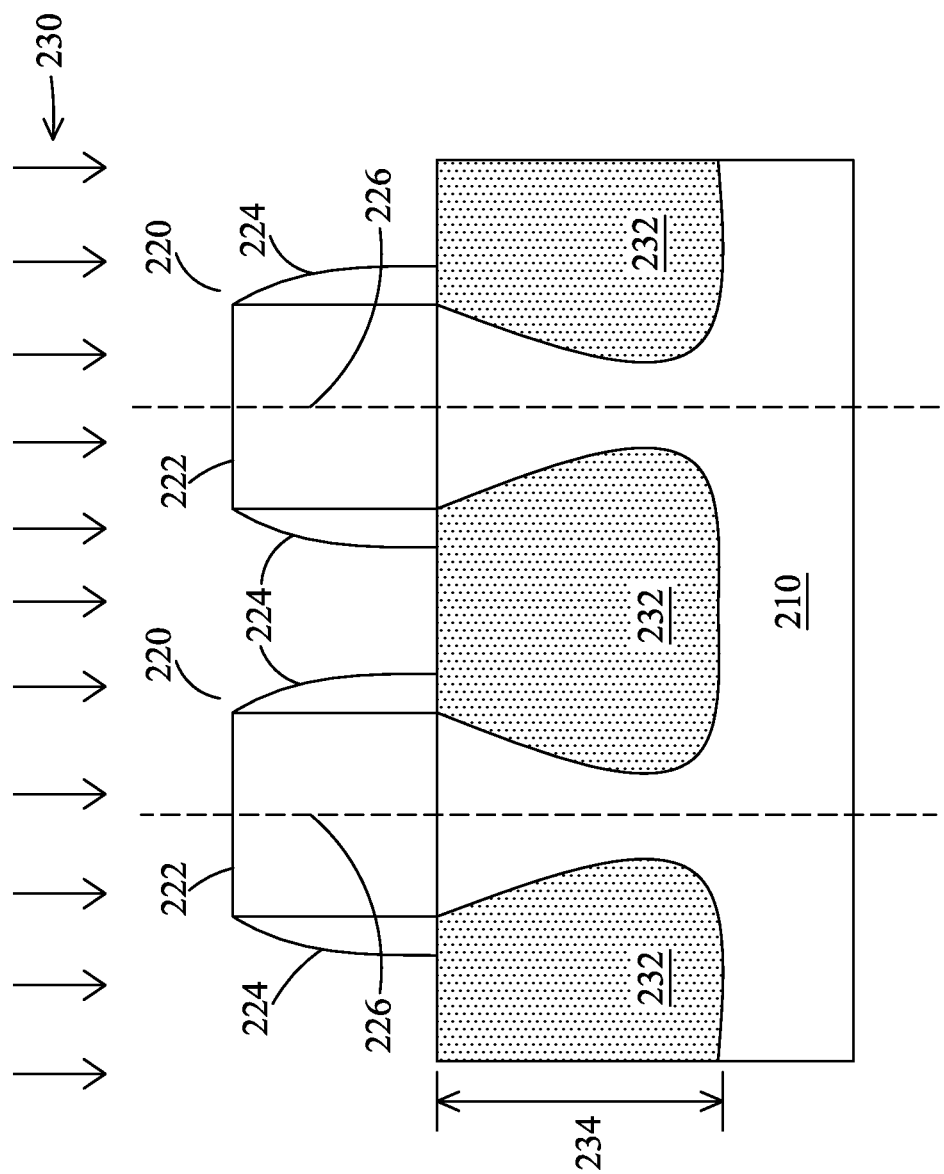

Referring to FIG. 3, a pre-amorphous implantation (PAI) process 230 is performed on the substrate 210. The PAI process 230 implants the substrate 210 with some species. The implanted species damage the lattice structure of the substrate 210 and form an amorphized region 232. In some embodiments, the implanted species scatter in substrate 210. The scattered species cause lateral amorphization, which results in amorphized region 232 extending to regions underneath the spacers 224. In some embodiments, the amorphized region 232 is formed in a source and drain region of the semiconductor device 200 and does not extend beyond the center line 226 of the gate structure 220. The amorphized region 232 has a depth 234. The amorphized depth 234 is formed according to design specifications. In some embodiments, the amorphized depth 234 is in a range from about 10 to about 150 nanometers. In some embodiments, the amorphized depth 234 is less than about 100 nanometers.

In some embodiments, the amorphized depth 234 is controlled by the thickness of the gate spacers 224, because the gate spacers 224 serve to concentrate the PAI process 230 implantation energy away from the center line 226 of the gate structure 220, thereby allowing for a deeper amorphized depth 234. In addition, the amorphized depth 234 is controlled by parameters of the PAI process 230, such as implant energy, implant species, and implant dosage, etc. The PAI process 230 implants the substrate 210 with silicon (Si) or germanium (Ge), in accordance with some embodiments. In some embodiments, other implant species heavier than Si are used. For example, in some embodiments, the PAI process 230 utilizes other implant species, such as Ar, Xe, $BF_2$, As, In, other suitable implant species, or combinations thereof. In some embodiments, the PAI process 230 implants species at an implant energy in a range from about 20 KeV to about 60 KeV. In some embodiments, the PAI process 230 implants species at a dosage ranging in a range from about $1 \times 10^{14}$ atoms/$cm^2$ to about $2 \times 10^{15}$ atoms/$cm^2$, depending on the implantation temperature. Lower implantation temperature enhances implant amorphization efficiency. In some embodiments, the implant temperature is in a range from about −100° C. to about 25° C. (or room temperature).

In some embodiments, a patterned photoresist layer is utilized to define where the amorphized region 232 is formed and protect other regions of the semiconductor device 200 from implantation damage. For example, the PMOS regions are protected. In addition, the patterned photoresist layer exposes the source/drain regions, such that the source/drain regions are exposed to the PAI process 230 (forming amorphized region 232) while the gate structure 220 (and other portions of the semiconductor device 200) are protected from the PAI process 230. Alternatively, a patterned hard mask layer, such as a SiN or SiON layer, is utilized to define the amorphized region. In some embodiments, the patterned photoresist layer or the patterned hard mask layer is part of the current manufacturing process, for example lightly-doped drains (LDD) or source/drain formation, thereby minimizing cost as no additional photoresist layer or hard mask is required for the PAI process 230. After the PAI process is performed, the photoresist on substrate 210 is removed.

Figure 4:
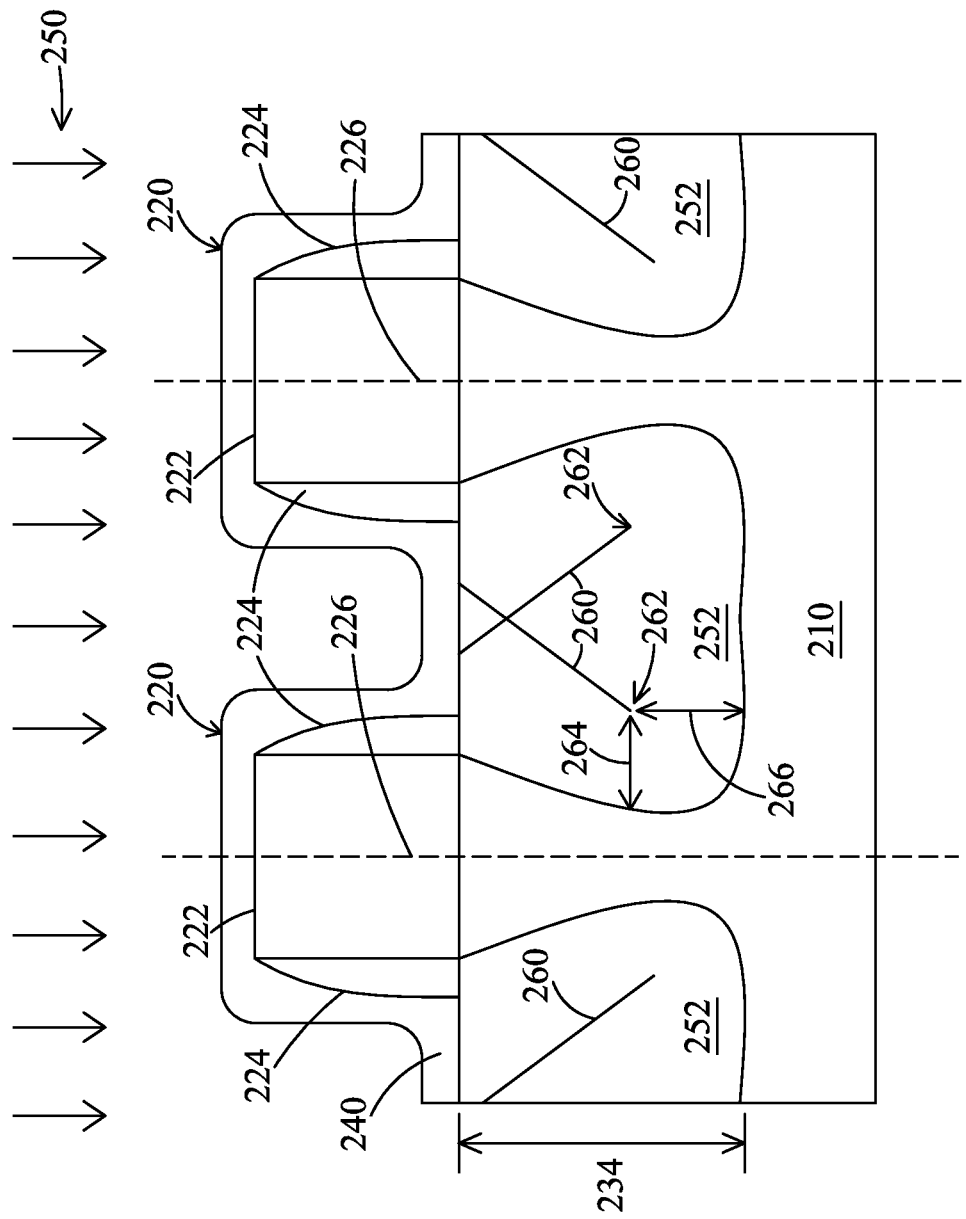

Referring to FIG. 4, a stress film 240 is deposited over the substrate 210. In some embodiments, the stress film 240 is formed by chemical vapor deposition (CVD), physical vapor deposition (PVD), atomic layer deposition (ALD), high density plasma CVD (HDPCVD), plating, other suitable methods, and/or combinations thereof. In some embodiments, the stress film 240 includes a dielectric material, such as silicon nitride, silicon oxide, silicon oxynitride, other suitable materials, and/or combinations thereof. The stress film 240 has tensile stress, which affects the recrystallization process. For example, the stress film 240 could retard the growth rate in the [110] direction of the stressor regions 252. In some embodiments, the stress film 240 is not used.

Still referring to FIG. 4, an annealing process 250 is performed on the substrate 210. The annealing process 250 causes the amorphized regions 232 to re-crystallize, forming stressor regions 252. This process is often referred to as solid-phase epitaxy (SPE), and thus, the stressor regions 252 are referred to as epi regions. The stressor regions 252 are, for example, epitaxial SiP stressor regions, epitaxial SiC, or SiCP stressor regions, in accordance with some embodiments. SiC stands for carbon-containing silicon and SiCP stands for carbon-and-phosphorous-containing silicon. In some embodiments, the carbon concentration is less than about 3 atomic %. In some embodiments, the P concentration is in a range from about 5E19 1/cm$^3$ to about 5E21 1/cm$^3$. In some embodiments, the P and/or C in silicon in the epitaxial stressor regions are implanted at previous operations. In some embodiments, carbon is implanted into a silicon substrate to create a SiC stressor, which is compressive and applies a tensile strain to the NMOS transistor channel region due to the small size of carbon (C) in comparison to silicon (Si). In addition, in some embodiments, the compressive film stress in the stressor regions assists the initiation of pinchoff. In some embodiments, P is doped to lower the resistance of the source and drain regions. In addition, in some embodiments, carbon impedes the out-diffusion of P.

In some embodiments, the annealing process 250 is a furnace process, a rapid thermal annealing (RTA) process, a millisecond thermal annealing (MSA) process (for example, a millisecond laser thermal annealing process), or a microsecond thermal annealing (μSA) process. In some embodiments, the annealing process includes a pre-heat operation which minimizes or even eliminates end of range (EOR) defects, which are the remained defects at the amorphous/crystalline interface. The pre-heat operation is performed at a temperature from about 200° C. to about 700° C., in accordance with some embodiments. The pre-heat operation is performed in a range from about 10 seconds to about 10 minutes, in some embodiments.

The main anneal of the annealing process 250 is performed at a temperature in a range from about 800° C. to about 1,400° C. Depending on the type of annealing process and the temperature utilized, the main anneal of the annealing process 250 is performed for a duration in a range from about 1 millisecond to about 5 hours, in some embodiments. For example, the pre-heat operation is at a temperature of about 550° C. for about 180 seconds. If the annealing process 250 is a RTA process, in some embodiments, the main anneal temperature is equal to or greater than about 950° C. and is performed for a duration in a range from about 0.5 second to about 5 seconds, in some embodiments. If the annealing process 250 is a MSA process, in some embodiments, the main anneal temperature is up to a Si melting point of about 1,400° C. and is performed for a few milliseconds or less, for example for about 0.8 milliseconds to about 100 milliseconds.

During the annealing process 250, as the substrate 210 recrystallizes, dislocations 260 are formed in the stressor region 252. In some embodiments, the dislocations 260 are formed in the [111] direction. In some embodiments, the [111] direction has an angle in a range from about 45 to about 65 degrees, the angle being measured with respect to an axis parallel to a surface of the substrate 210.

The dislocations 260 start formation at pinchoff points 262. In some embodiments, the pinchoff points 262 are formed in the stressor region 252 at a depth of about 10 to about 150 nanometers, the depth being measured from the surface of the substrate 210. The pinchoff points 262 have a horizontal buffer 264 and a vertical buffer 266. The horizontal buffer 264 and the vertical buffer 266 are formed according to design specifications and are affected by the annealing process 250. The pinchoff points 262 have a horizontal buffer 264 of about 5 to about 20 nanometers and a vertical buffer 266 of about 10 to about 40 nanometers, in some embodiments. In some embodiments, the pinchoff points 262 are formed such that the pinchoff points 262 are not disposed within the channel region.

Figure 5:
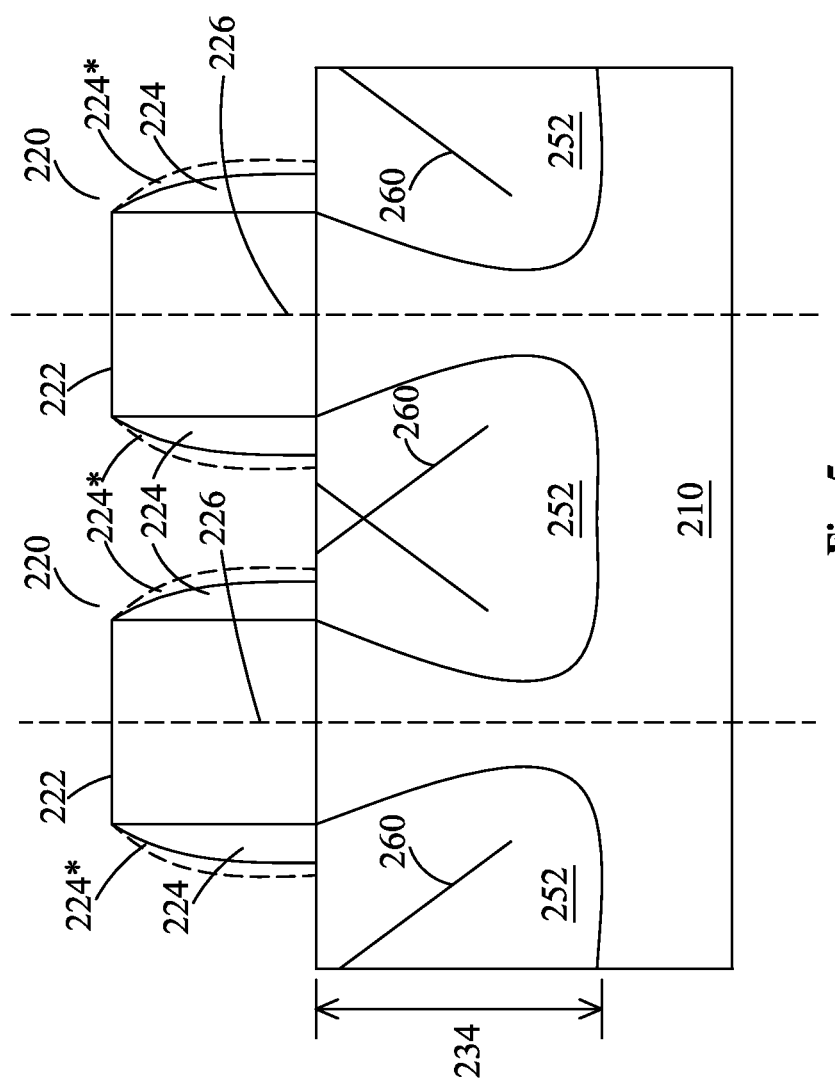

Referring to FIG. 5, the stress film 240 is removed from the substrate 210. In some embodiments, the gate spacers 224 are also removed from the gate structure 220. The stress film 240 and optionally the gate spacers 224 are removed by an etching process. In some embodiments, the etching process is performed by wet etching, such as by using phosphoric acid or hydrofluoric acid, or by dry etching using suitable etchant. In some embodiments, the formation of spacers, PAI process, formation of stress film, annealing, and removal of stress film described above are repeated a number of times to create multiple dislocations. Further details of multiple dislocations in the stress regions 252 are found in U.S. patent application Ser. No. 13/177,309, entitled "A Semiconductor Device with a Dislocation Structure and Method of Forming the Same" and filed on Jul. 6, 2011, which is incorporated herein by reference in its entirety.

After the stress film 240 is removed, optional dummy spacers 224* are formed on gate structure 220, in accordance with some embodiments. In some embodiments, the dummy spacers 224* are used to define the distances of subsequently formed doped regions from the channel regions. In some embodiments, the dummy spacers 224*, similar to gate spacers 224, are formed over the gate spacers 224 by any suitable process to any suitable thickness. The dummy spacers 224* include a dielectric material, such as silicon nitride, silicon oxide, silicon oxynitride, other suitable materials, and/or combinations thereof.

Figure 6:
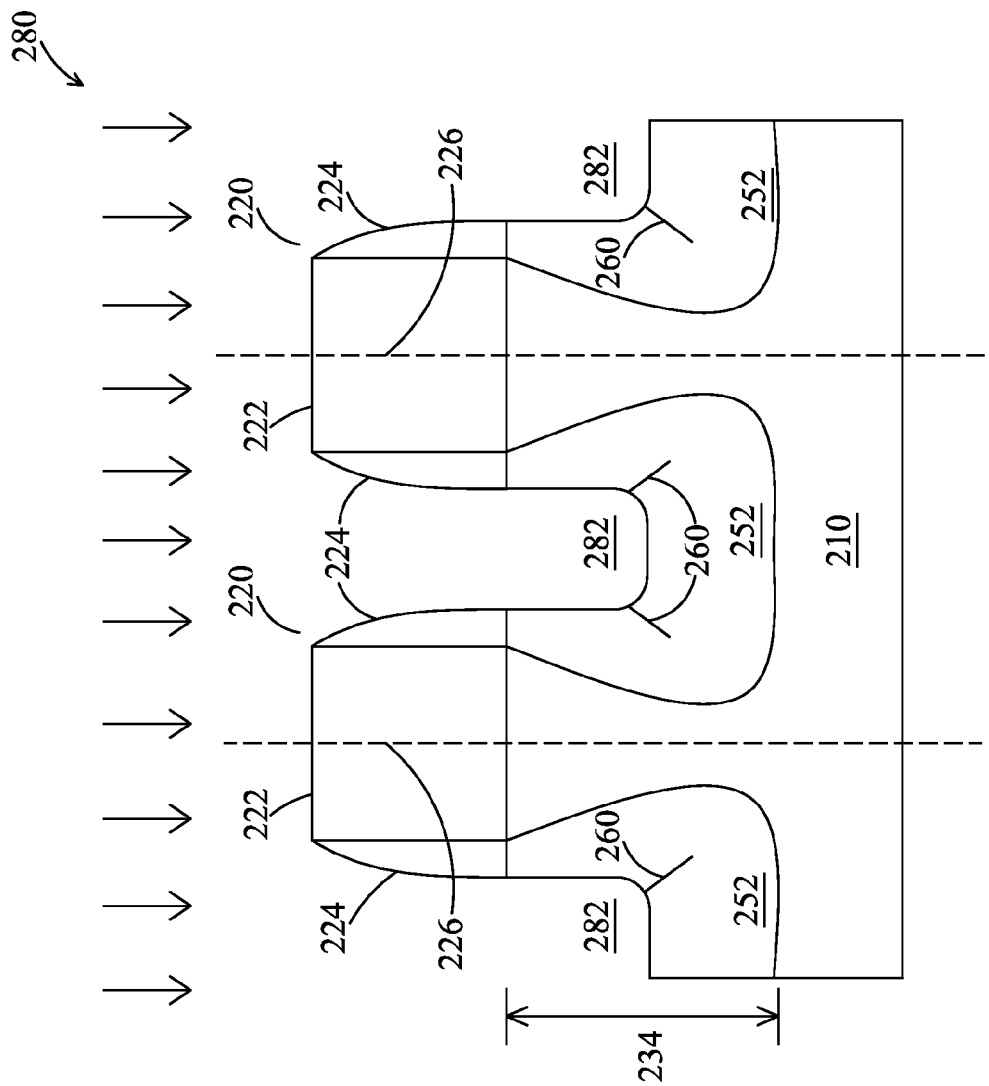

Afterwards, recess regions are formed by etching process(es). In some embodiments, the etching process includes a dry etching process, wet etching process, or combination thereof. In some embodiments, the etching process utilizes a combination of dry and wet etching processes. The dry and wet etching processes have tunable etching parameters, such as etchants used, etching temperature, etching solution concentration, etching pressure, source power, RF bias voltage, RF bias power, etchant flow rate, and other suitable parameters. In some embodiments, recess regions 282 are formed on substrate 210, as shown in FIG. 6 in accordance with some embodiments. In some embodiments, a patterned photoresist layer is utilized to define where the recess regions 282 are formed and protect other regions of the semiconductor device 200 from implantation damage. For example, in some embodiments, the PMOS regions are protected. In addition, the patterned photoresist layer exposes the source/drain regions, such that the source/drain regions are exposed to the dry etch process 280 (forming amorphized region 282) while the gate structure 220 (and other portions of the semiconductor device 200) are protected from the etch process 280. For example, in some embodiments, the dry etching process utilizes an etching pressure of about 1 mTorr to about 200 mTorr, a source power of about 200 W to about 2000 W, an RF bias voltage of about 0 V to about 100 V, and an etchant that includes $NF_3$, $C_{12}$, $SF_6$, He, Ar, $CF_4$, or combinations thereof.

Figure 7:
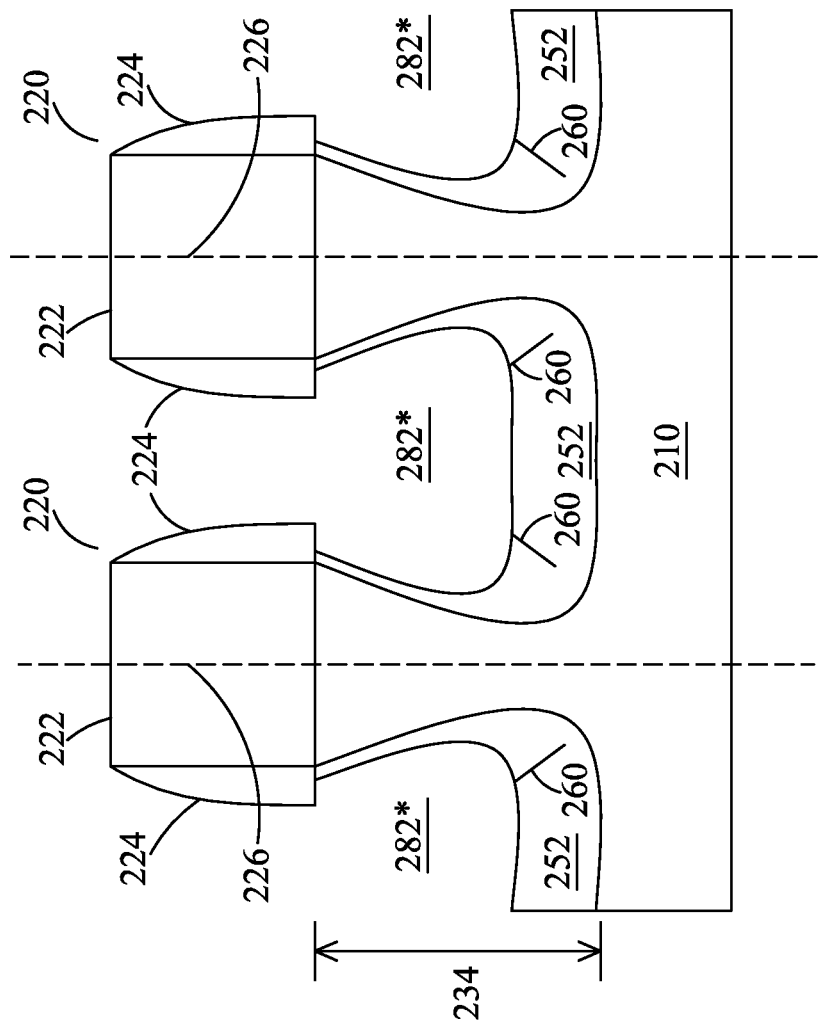

After the etch process 280 is performed, the photoresist on substrate 210 is removed. After the recess regions 282 are formed, substrate 210 undergoes a wet etch to form recess regions 282*, as shown in FIG. 7, in accordance with some embodiments. In some embodiments, the wet etching solutions include $N_{H4}OH$, HF (hydrofluoric acid), TMAH (tetramethylammonium hydroxide), other suitable wet etching solutions, or combinations thereof.

In some embodiments, the recess regions 282* have depths in a range from about 100 Å to about 800 Å. The widths of recess regions 282* near surface of substrate 210 are in a range from about 20 nm to about 200 nm. As mentioned above, in some embodiments, the widths of recess regions 282* extend under spacer 224, 224* (not shown in FIG. 7), or a combination thereof.

Figure 8:
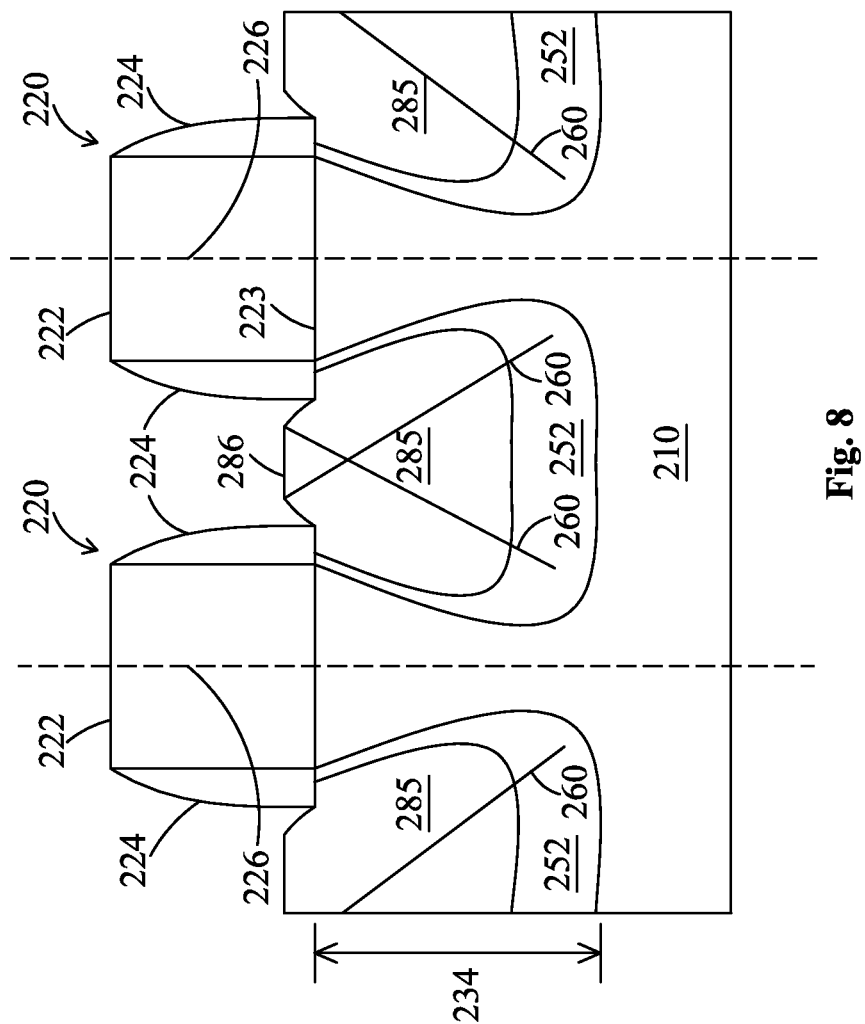

Afterwards, a silicon-containing epitaxial structure 285 is formed in each of the recesses 282*, as shown in FIG. 8, in accordance with some embodiments. The silicon-containing structure 285 is formed by performing an epitaxial deposition process to form a silicon-containing epitaxial material, in some embodiments. In some embodiments, the silicon-containing epitaxial material includes SiC, SiCP, SiP or other material that produces tensile strain on the transistor channel region. In some embodiments, the silicon-containing material is formed by using a silicon-containing precursor. For example, in some embodiments, gases, such as silane ($Si_{H4}$), disilane ($S_{i2H6}$), trisilane ($S_{i3H8}$), dichlorosilane ($Si_{H2}C_{12}$), etc., are used to form SiC-containing epitaxial material in structure 285. In some embodiments, phosphorous-containing gas, such as phosphine ($P_{H3}$), is used to form SiP epitaxial material or to form SiCP with a carbon-containing gas. In other embodiments forming P-type transistors, the silicon-containing epitaxial material includes any material, such as SiGe, that produces compressive strain on the transistor channel region.

In some embodiments, the surface 286 of the silicon-containing epitaxial structure 285 is level with or higher than the surface 223 (or interface 223) of the substrate 210 and the gate structure 220. In some embodiments, the surface 286 has a height of up to about 300 Å above the substrate surface 223. Since the silicon-containing epitaxial structure 285 is also epitaxial, the dislocations 260 continue in structure 285, as shown in FIG. 8, in accordance with some embodiments.

In some embodiments, the silicon-containing epitaxial material is formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD, molecular beam epitaxy (MBE) process, any suitable epitaxial process; or any combinations thereof. In some embodiments, the deposition of the silicon-containing epitaxial material has a deposition temperature of about 750° C. or less. In other embodiments, the etching temperature ranges from about 500° C. to about 750° C. In some embodiments, the pressure of the deposition process ranges from about 50 Torr to about 500 Torr.

Alternatively, the silicon-containing epitaxial material is formed by performing an epitaxial deposition process to form a silicon-containing epitaxial material. Details of such process are described in U.S. patent application Ser. No. 13/029,378, entitled "Integrated Circuits and Fabrication Methods Thereof" and filed on Feb. 17, 2011.

In some embodiments, the semiconductor device 200 undergoes further CMOS or MOS technology processing to form various features known in the art. For example, in some embodiments, the method 100 proceeds to form main spacers. In some embodiments, contact features, such as silicide regions, are also formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In some embodiments, the contact features are formed by a process that includes depositing a metal layer, annealing the metal layer such that the metal layer is able to react with silicon to form silicide, and then removing the non-reacted metal layer. In some embodiments, an inter-level dielectric (ILD) layer is further formed on the substrate 210 and a chemical mechanical polishing (CMP) process is further applied to the substrate to planarize the substrate. Further, in some embodiments, a contact etch stop layer (CESL) is formed on top of the gate structure 220 before forming the ILD layer.

In an embodiment, the gate stack 222 remains polysilicon in the final device. In another embodiment, a gate replacement process (or gate last process) is performed, where the polysilicon gate stack 222 is replaced with a metal gate. For example, a metal gate replaces the gate stack (i.e., polysilicon gate stack) of the gate structure 220. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

In some embodiments, subsequent processing further forms various contacts/vias/lines and multilayer interconnect features (e.g., metal layers and interlayer dielectrics) on the substrate 210, configured to connect the various features or structures of the semiconductor device 200. In some embodiments, the additional features provide electrical interconnection to the device. For example, a multilayer interconnection includes vertical interconnects, such as conventional vias or contacts, and horizontal interconnects, such as metal lines. In some embodiments, the various interconnection features implement various conductive materials including copper, tungsten, and/or silicide. In one example, a damascene and/or dual damascene process is used to form a copper related multilayer interconnection structure.

The disclosed semiconductor device 200 is used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The embodiments of processes and structures described above provide mechanisms for improving mobility of carriers. The dislocations in the source and drain regions and the strain created by the doped epitaxial materials next to the channel region of a transistor both contribute to the strain in the channel region. As a result, the device performance is improved. In some embodiments, the NMOS transistor performance is increased by about 10-25%.

One aspect of this description relates to a method of manufacturing a semiconductor device. The method includes performing a pre-amorphous implantation (PAI) process to form an amorphized region on a substrate. The method also includes forming a stress film over the substrate, and performing an annealing process to recrystallize the amorphized region after the stress film is formed. The method further includes forming a recess region on the substrate. The recess region overlies the recrystallized region. The method additionally includes forming an epitaxial stress-inducing material in the recess region.

Another aspect of this description relates to a method of manufacturing a semiconductor device. The method includes performing a pre-amorphous implantation (PAI) process to form an amorphized region on a substrate, and forming a stress film over the substrate. The method further includes forming at least one dislocation in the amorphized region, wherein a pinch off point of the at least one dislocation is spaced from a bottom edge of the amorphized region by a distance ranging from about 10 nanometers (nm) to about 40 nm. The method further includes forming a recess region on the substrate, wherein the recess region overlies at least a portion of the at least on dislocation, and forming an epitaxial stress-inducing material in the recess region.

Still another aspect for this description relates to a method of making a semiconductor device. The method includes forming a first stress region in a semiconductor substrate, the first stress region including at least one dislocation. A gate structure is disposed over a channel region of the semiconductor substrate. The method further includes forming a second stress region in the semiconductor substrate and overlying the first stress region.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    performing a pre-amorphous implantation (PAI) process to form an amorphized region on a substrate;
    forming a stress film over the substrate;
    performing an annealing process to recrystallize the amorphized region after the stress film is formed;
    forming a recess region on the substrate, wherein the recess region overlies the recrystallized region; and
    forming an epitaxial stress-inducing material in the recess region.

2. The method of claim 1, wherein the recrystallized region includes at least one dislocation.

3. The method of claim 1, wherein performing the PAI process includes implanting the substrate with silicon (Si) or germanium (Ge) implant species.

4. The method of claim 1, wherein the annealing process includes a rapid thermal annealing (RTA) process, a millisecond thermal annealing (MSA) process, or a microsecond thermal annealing (OA) process.

5. The method of claim 1, wherein the epitaxial stress-inducing material includes SiC, SiP, or SiCP.

6. The method of claim 1, wherein forming the recess region utilizes a wet etch after a dry etch.

7. The method of claim 1, further comprising:
    forming spacers on each side of a gate stack, wherein the gate stack is on the substrate.

8. The method of claim 1, wherein performing the PAI processes comprises forming the amorphized region having a depth ranging from about 10 nm to about 150 nm.

9. The method of claim 1, wherein performing the PAI process comprises implanting a species in the substrate, wherein the species comprises at least one of silicon, germanium, argon, xenon, or boron difluoride.

10. The method of claim 1, wherein performing the PAI process comprises implanting a species in the substrate at a temperature ranging from about −100° C. to about 25° C.

11. The method of claim 1, wherein performing the PAI process comprises implanting a species in the substrate in a concentration ranging from about $1 \times 10^{14}$ atoms/cm$^2$ to about $2 \times 10^{15}$ atoms/cm$^2$.

12. The method of claim 1, wherein forming the stress film comprises forming the stress film to retard a growth rate in the direction of the amorphized region.

13. The method of claim 1, wherein forming the recess region comprises forming the recess region having a depth ranging from about 100 angstroms (Å) and about 800 Å and a width at a surface of the substrate ranging from about 20 nm to about 200 nm.

14. A method of manufacturing a semiconductor device, the method comprising:
    performing a pre-amorphous implantation (PAI) process to form an amorphized region on a substrate;

forming a stress film over the substrate;

forming at least one dislocation in the amorphized region, wherein a pinch off point of the at least one dislocation is spaced from a bottom edge of the amorphized region by a distance ranging from about 10 nanometers (nm) to about 40 nm;

forming a recess region on the substrate, wherein the recess region overlies at least a portion of the at least on dislocation; and forming an epitaxial stress-inducing material in the recess region.

15. The method of claim 14, wherein forming the at least one dislocation comprises performing a rapid thermal anneal process, a millisecond thermal anneal process, or a microsecond thermal anneal process.

16. The method of claim 14, wherein forming the at least on dislocation comprises:

performing a pre-heating process; and performing a main heating process after the pre-heating process.

17. The method of claim 16, wherein performing the pre-heating process comprises heating the substrate at a first temperature ranging from about 200° C. to about 700° C. for a first duration ranging from about 10 seconds to about 10 minutes, and performing the main heating process comprises heating the substrate at a second temperature ranging from about 800° C. to about 1400° C. for a second duration ranging from about 1 millisecond to about 5 hours.

18. The method of claim 14, wherein forming the recess region comprises performing a dry etching process using an etchant comprising at least one of $NF_3$, $Cl_2$, $SF_4$, He, Ar, or $CF_4$.

19. The method of claim 14, wherein forming the recess region comprises performing a wet etching process using an etchant comprising at least one of $NH_4OH$, HF, or TMAH.

20. A method of making a semiconductor device, the method comprising:

forming a first stress region in a semiconductor substrate, the first stress region including at least one dislocation, wherein a gate structure is disposed over a channel region of the semiconductor substrate; and forming a second stress region in the semiconductor substrate and overlying the first stress region, wherein the at least one dislocation is continuous from the first stress region to the second stress region.

* * * * *